Nov. 16, 1965 D. L. SCHULTZ 3,218,606
SOCKET ASSEMBLY FOR PRINTED CIRCUITS
Filed Jan. 20, 1964 2 Sheets-Sheet 1

INVENTOR.
DONALD L. SCHULTZ
BY George C. Sullivan
Agent

Nov. 16, 1965 D. L. SCHULTZ 3,218,606

SOCKET ASSEMBLY FOR PRINTED CIRCUITS

Filed Jan. 20, 1964 2 Sheets-Sheet 2

INVENTOR.
DONALD L. SCHULTZ
BY George C. Sullivan
Agent

United States Patent Office 3,218,606

Patented Nov. 16, 1965

3,218,606

SOCKET ASSEMBLY FOR PRINTED CIRCUITS

Donald L. Schultz, Dunellen, N.J., assignor to Lockheed Aircraft Corporation, Burbank, Calif.

Filed Jan. 20, 1964, Ser. No. 338,847
4 Claims. (Cl. 339—256)

This invention relates generally to miniature and subminiature electrical connectors and more particularly to a socket assembly for use in connecting electronic components to printed circuit boards.

In the manufacture of electronic devices utilizing printed circuit boards, it is recognized that packaging techniques other than those employing conventional wire leads and solder terminals to connect the printed circuit with input and output conductors and with the associated electronic components, such as amplifiers, frequency networks, conductors, capacitors, resistors, relays, etc. are needed in order to realize the full advantages of the printed circuit. With packaging techniques such as is described in applicant's co-pending application, Serial Number 348,016, for example, the electronic components connecting with the printed circuit board may be of modular construction such that the individual components or assemblages may be removably secured directly to the printed circuit board by pin and socket. Such pin and socket must not only be extremely small in size, but must also maintain good electrical contact over widely-varying environmental conditions and provide adequate mechanical support for the electronic module. These requirements for miniaturization and both electrical and mechanical reliability are not met by socket assemblies heretofore available.

The pin and socket herein disclosed comprise a malleable housing and a split sleeve spring contact element within the housing which is adapted to receive a pin and hold the same in the socket by frictional force, permitting withdrawal of the pin but only by exerting a withdrawal force of predetermined magnitude exceeding that to which the assembly might be subjected in use.

Due primarily to the detail construction features of the housing and pin contact element and the materials from which they are made, modest dimentional variations in the size of the socket assembly parts resulting from manufacturing tolerances or different material thermal coefficients of expansion are permissible without materially altering the electrical conductivity or pin withdrawal force characteristics. It will of course be appreciated that this is most important where the parts, as here, must be made by economical production methods and extremely small in size.

It is an object of this invention to provide a pin and socket assembly for printed circuit boards and the like wherein the socket assembly includes a split sleeve contact which will grip the pin and, in so doing, be expanded to also forcefully engage the socket wall to insure good low-resistance electrical contact between all the elements of the assemblage and compensate for nominal dimensional tolerances and changes over widely-varying temperature conditions.

It is another object of this invention to provide a socket assembly wherein its parts may be made from different materials having different thermal coefficients of expansion using standard quantity production methods and tolerances.

Still another object of this invention is to provide a pin socket especially suited for printed circuit boards and adapted to installation on the boards by efficient machine methods.

It is still another object of this invention to provide a socket assembly which provides firm structural support for the pin when received in the socket and utilize the pin to add strength and rigidity to the socket and its mounting on the circuit board. Thus, the socket housing may be thin-walled and otherwise fully compatible with design requirements for miniaturization and subminiaturization.

Further and other objects will become apparent from a reading of the following description, especially when considered in combination with the accompanying drawings wherein like numerals refer to like parts.

Figure 4:
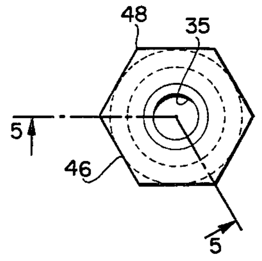
Figure 5:
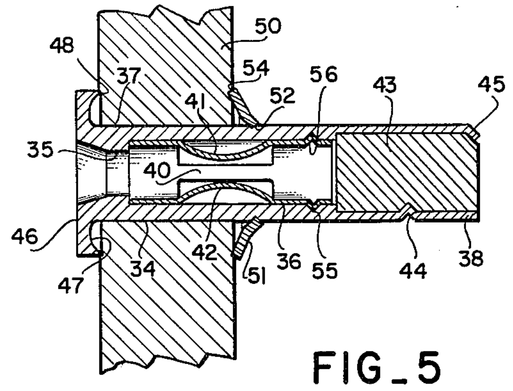
Figure 6:
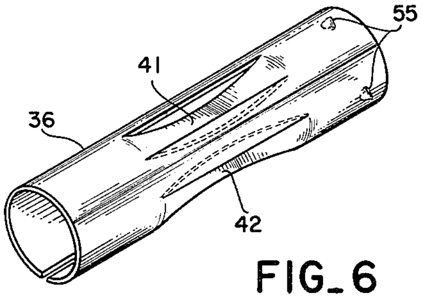
Figure 7:
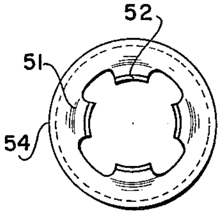

FIGURES 4 and 5, respectively, are a top view and a sectional side view taken on line 5—5 of FIGURE 4 showing a modification of the socket assembly;

FIGURE 6 is a plan view of the split sleeve contact member for the modified socket assembly of FIGURES 4 and 5; and FIGURE 7 is a plan view of a retainer used in mounting the modified socket assembly of FIGURES 4 and 5 onto a printed circuit board.

Figure 1:
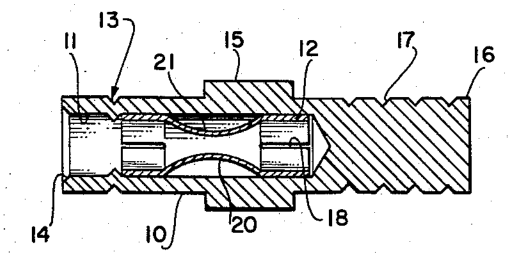
FIGURE 1 is a sectional side view of the socket assembly.

Referring now to the socket assembly of FIGURE 1, there is shown a generally cylindrically-shaped housing 10 of malleable, electrically conductive material such as annealed brass. An opening or well 11, extending axially into but not through the housing, receives a split sleeve contact element 12 which is preferably bottomed in the well and retained recessed therein for limited axial movement by suitable means, such as staking, as indicated by indentations 13 formed in the wall of housing 10. The mouth 14 of well 11 extends above contact element 12 to form a collar which is mildly beveled as shown in FIGURE 1 to permit flaring the housing wall for installation on a printed circuit board or the like, as hereinafter more particularly described in connection with FIGURE 3. A mounting flange 15 extending circumferentially around the housing is also employed in the FIGURE 1 configuration to provide means for mounting the socket assembly. The closed end 16 of housing 10 serves as a fixed pin on the socket assembly to which may be connected one or more conductors by soldering or the like and, to facilitate such attachments, a plurality of shallow circumferential grooves 17 are formed on the outer wall between flange 15 and the outer extremity of closed end 16. The length of the closed end 16 on socket housing 10 may obviously be made to any length desired; provided however, it should not be so short as to expose contact 12 in well 11 and permit the circulation of air through the well and around the contact.

Figure 2:
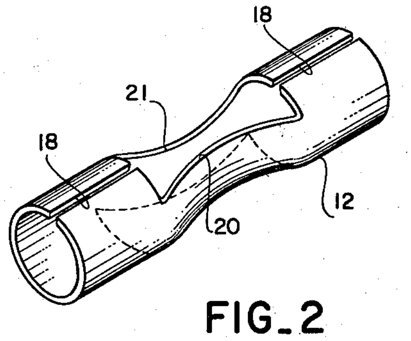
FIGURE 2 is a perspective view of the split sleeve contact element of the socket assembly.

Split sleeve contact 12, as best shown in FIGURE 2, is generally tubular in shape with an axial split 18 running the length thereof to permit expansion within well 11 of housing 10 to maintain surface-to-surface contact with the housing wall. Contact 12 must be electrically conductive and is preferably of a material exhibiting spring action such as, for example, heat-treated beryllium copper alloy. The free state diameter of split sleeve contact 12 should be slightly greater than the diameter of well 11 with split 18 providing a sufficient gap to permit compressing the contact to a diameter equal to, or slightly less than, that of the well, so that it may be inserted therein to press outwardly on the housing by its own spring action. Two or more resilient detents 20 and 21 are suitably formed in the wall of contact 12 to project inwardly of the sleeve and firmly constrain a pin such as 32 in FIGURE 3 when inserted into the contact element between the detents.

Figure 3:
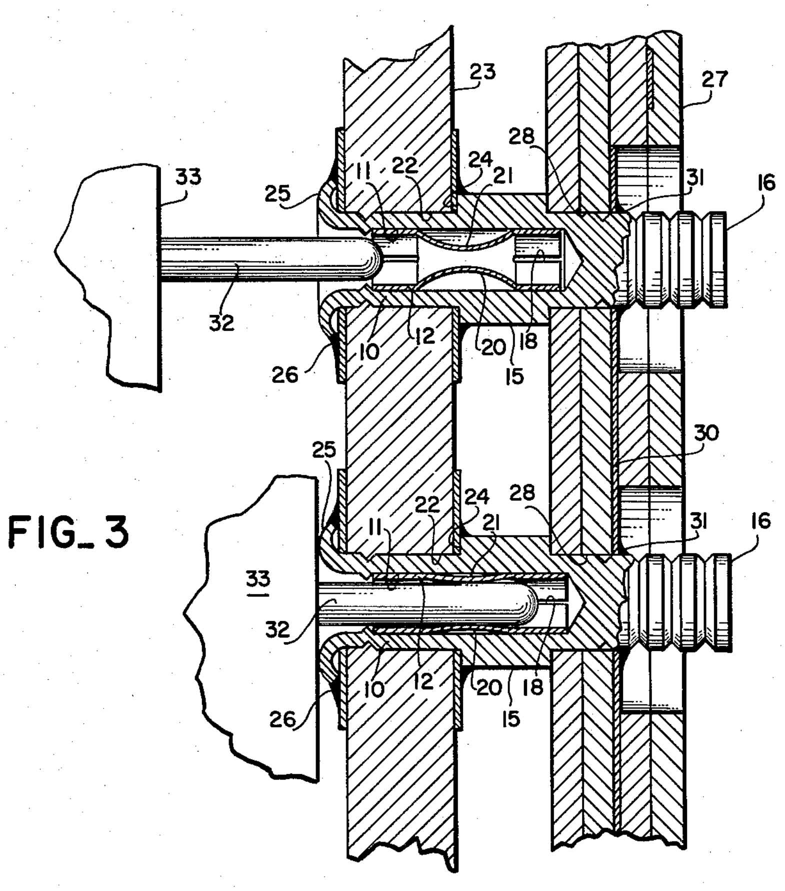
FIGURE 3 is a fragmentary sectional view of the pin and socket assembly in a typical printed circuit board installation.

A typical installation of the socket assembly is shown in FIGURE 3 wherein socket housing 10 is inserted through an opening 22 formed in printed circuit board 23. Flange 15 formed on the outer surface of housing 10 provides a seat 24 for engaging board 23 around opening 22 and positioning the socket housing with respect to the board. The housing wall 25 at the well mouth end projects through opening 22 beyond the circuit board and is suitably flared to permanently secure the socket assembly to the board. At the junctions of socket housing 10 with conductors on the printed circuit board, solder may be applied as at 26 in FIGURE 3 to assure a low resistance electrical path from the printed circuit conductor to the socket housing; however, this is not essential, provided the flaring of housing 10 expands sufficiently to tightly engage the edge of the conductor around the opening.

The closed end 16 of socket housing 10 provides a fixed pin on the socket to which additional conductors may be connected. As shown in FIGURE 3, a multi-layer printed circuit cable 27 is provided with an opening 28 through which the closed end 16 of the housing projects. The cable seats against flange 15 with one of its conductors 30 being soldered as at 31 to the grooved surface on the closed end of the socket housing; the grooves serving to aid in providing a strong soldered connection between the cable and the socket housing.

The pins 32 as shown in FIGURE 3 are secured to an electronic component module and serve in cooperation with the socket assembly to mount the module directly onto the circuit board by inserting each of its several associated pins into a socket assembly. Detents such as 20 and 21 formed in contact 12 frictionally engage pin 32 and exert a gripping force thereon sufficient to prevent inadvertent withdrawal, but permit extraction of the pin for removal of the module if and when desired for replacement or repair purposes. As detents 20 and 21 press against pin 32, contact 12 is urged to expand tightly against the wall of housing 10 within well 11 and maintain the application of such forces under widely varying environmental temperature conditions causing relative expansion or contraction of the socket housing with respect to contact 12. So long as detents 20 and 21 on contact 12 are only partially deflected as a result of insertion of pin 32, dimensional tolerances of the parts are likewise automatically compensated for by spring action of the contact to always maintain good low resistance electrical connection between the several elements. Moreover, it will be recognized that the expansion forces acting on the wall of housing 10 in the plane of the circuit board tend to prevent buckling of the housing wall, allowing it to be made very thin and still provide a strong mechanical coupling between the printed circuit board and the electronic component module mounted thereon through the pin and socket assembly.

A modified form of socket assembly is shown in FIGURES 4 through 7 wherein socket housing 34 is provided with an axial through-hole 35 with stepped diameters for positive location and retention of contact 36. In this configuration, the stepped diameters of hole 35 place the smallest diameter at the pin-receiving end 37 of the socket and the largest diameter at the opposite end 38. Contact 36, like contact 12 in the FIGURE 1 structure, is a split sleeve with a plurality, in this case three (3) spring detents 40, 41 and 42 formed by slitted wall sections of the sleeve. The electrically conductive material of contact 36 is likewise preferably of spring metal such as heat-treated beryllium copper alloy and is formed to have a free state diameter greater than the opening in which it is inserted in the housing. To locate and retain the contact and to close the socket, a plug 43 is inserted and mechanically held in place at the bottom end 38 of the housing opening by suitable means such as staking 44 or bent tab 45 or both, as shown in FIGURE 5.

The pin-receiving end 37 of modified socket housing 34 has a preformed polygonally-shaped head 46 which is undercut at 47 to provide a plurality of high pressure contact points 48 to engage the printed board conductor. Because the housing is provided with a preformed head, it may be, and is, preferably made of a harder and less ductile material than housing 10, such as half hard brass. This material is still somewhat malleable, but yet of sufficient strength that high pressure contact points 48 will not appreciably deform on installation of the socket assembly in a printed circuit board.

The socket assembly of FIGURES 4 and 5 is secured to a printed circuit board such as 50 by a dome-shaped annular spring retainer 51 which is slid onto the housing to confine the circuit board 50 between socket head 46 and retainer 51. The detail construction of retainer 51 is best shown in FIGURE 7 wherein is shown a plurality of teeth 52 formed on the inner edge of the retainer for bitingly engaging the wall of housing 34 to prevent retrograde movement while the outer periphery 54 is adapted to engage circuit board 50. By making the retainer of heat-treated beryllium copper or other spring metal, it will by spring action retain the socket assembly firmly mounted on the printed circuit board with the high pressure contact points 48 of head 46 imbedded in the conductor, even when subjected to a high vibration environment and widely varying temperature extremes. No soldering of the socket housing to the printed circuit board conductor is needed with this socket configuration.

To facilitate retention of contact 36 in housing 34 and prevent rotation thereof relative to the housing, suitable means such as detents 55 may be formed in the contact sleeve to index with slightly undersized but generally mating recesses 56 formed in the wall of the housing. Since the contact sleeve is split and compressed on assembly, detents 55 additionally provide high-pressure contact points defining a low resistance electrical path from the contact element to the housing of the socket assembly in a manner analogous to the high-pressure contact points 48 on head 46.

All parts of the socket assembly of both the FIGURE 1 and FIGURE 5 configurations are preferably plated such as with gold for low electrical contact resistance and, in this connection, the construction of the FIGURE 5 socket wherein hole 35 extends entirely through the housing is desirable to permit reliable plating by processes having low throwing power. Plug 43 would be inserted in the housing after plating. In the FIGURE 1 socket housing which is shown as being made from a single piece of bar stock, plating at the bottom of the well is made difficult and, accordingly, if desired, the well bottom might of course be drilled out for plating and then plugged as in the FIGURE 5 configuration without departing from the teachings of this invention.

It should be understood that the specific embodiments disclosed herein are for purposes of illustration rather than limitation and that certain alterations, modifications and substitutions may be made to the instant disclosure without departing from the teachings of the invention as defined by the spirit and scope of the appended claims.

I claim:

1. A socket assembly for connecting electrical contact pins to printed circuit means comprising, a generally cylindrically shaped electrically conductive housing, a mounting flange formed on the outer wall of said housing intermediate the ends thereof and providing opposed generally radial shoulders adapted to position limit printed circuit means for securement to the housing, said housing having a generally axial bore formed therein open at only one end, the opposite closed end of said housing extending beyond said flange and having shallow grooves formed thereon for solder attachment of a first printed circuit, a split sleeve electrically conductive contact member slidably received and recessed within the bore of said housing, said split sleeve contact member having a plurality of inwardly directed electrically conductive resilient detents formed intermediate the ends thereof for slidably receiving an electrical contact pin therebetween and floatingly grip the same to urge expansion of said split sleeve contact member and maintain firm engagement of the latter with the wall of said housing, detent means projecting from the wall of said housing within said bore confining said split sleeve in the housing between the detent and the closed end of said bore, and a head-forming flarable collar on said housing between said detent means and the mouth of said bore for securing a second printed circuit to the housing.

2. A socket assembly for releasably securing electrical contact pins to printed circuit boards and the like comprising, an electrically conductive housing adapted to be secured to a printed circuit board, said housing having a bore formed therein, a polygonally-shaped flange formed on the open bore end of said housing and extending transversely outwardly therefrom to provide a head for engaging the printed circuit board around an opening formed therethrough for receiving said housing, the underside of said flange being undercut to form a plurality of high pressure contact points, an annularly shaped concave retainer ring slidably received externally on said housing for confining the printed circuit board between said concave retainer ring and said head, said retainer ring having stiffly flexible teeth formed on its inner edge for bitingly engaging the housing and permitting only unidirectional movement thereon toward said head whereby the socket housing may be firmly secured to the printed circuit board with the high pressure contact points held in contact with the board by the spring action of the retainer ring exerting a continuous compressive load upon the board, an electrically conductive expandable split sleeve contact member slidably received within the bore of said housing and retained therein for limited axial movement, and a plurality of inwardly directed electrically conductive resilient detents carried on said split sleeve contact member for slidably receiving the electrical contact pin therebetween and firmly gripping the same to urge expansion of said split sleeve contact member and maintain firm engagement of the latter with the wall of said housing over a limited range of different bore diameters such as result, for example, from thermal expansion and contraction of the housing under widely varying temperature conditions.

3. A socket assembly for connecting electrical contact pins to flat conductors comprising, a generally tubular electrically conductive housing having an axial through-hole bore with at least two stepped diameters formed therein, a plug in said housing closing one end of said bore and abutting the shoulder formed between adjacent stepped diameters, detent means formed in said housing for holding said plug against movement relative to the housing, a split sleeve electrically conductive contact member slidably received within the bore of said housing and generally abutting said plug, retainer means formed in said housing and confining said split sleeve recessed within the bore thereof, at least one dimple formed on said split sleeve, a recess formed in said housing and engaging said dimple formed on said split sleeve for decreasing electrical contact resistance between said split sleeve and said housing, said split sleeve contact member having a plurality of inwardly directed electrically conductive resilient detents formed intermediate the ends thereof for slidably receiving an electrical contact pin therebetween and floatingly gripping the same to urge expansion of said split sleeve contact member and maintain firm engagement of the latter with the wall of said housing, and a radially outwardly projecting generally polygonally-shaped head formed on said housing around the entrance to said bore for mounting said housing.

4. A socket assembly for connecting electrical contact pins to printed circuit boards comprising, a generally cylindrically-shaped electrically conductive housing, a flange carried on said housing intermediate the ends thereof and projecting generally radially outwardly therefrom to provide at least one shoulder to position limit a printed circuit board for securement to the housing, said housing having a generally axial bore formed therein open at only one end, the opposite closed end of said housing forming a fixed pin on the socket for connecting conductors thereto, a full split sleeve electrically conductive contact member slidably received within the bore of said housing, detent means projecting from the wall of said housing intermediate the ends thereof within said bore and confining said split sleeve in the housing between the detent and the closed end of said bore, said split sleeve contact member having a plurality of inwardly directed electrically conductive resilient detents intermediate the ends thereof, said resilient detents being so shaped that upon entry of a pin intended to be used with the device the resilient detents will be deformed to floatingly grip the pin and to urge expansion of said split sleeve contact member and maintain firm engagement of the latter with the wall of said housing by the spring action of said split sleeve and resilient detents and to axially separate the sleeve end portions for limiting confinement between the bottom of the bore and the housing detent means, and head means at the open bore end of said housing for firmly engaging a printed circuit board by confining the latter between said head means and said flange.

References Cited by the Examiner

UNITED STATES PATENTS

| | | | |
|---|---|---|---|
| 1,583,844 | 5/1926 | Ile | 339—258 X |
| 1,716,144 | 6/1929 | Morrison | 339—215 |
| 2,490,317 | 12/1949 | Ostrak | 339—262 |
| 2,523,001 | 9/1950 | Lamater | 339—221 |
| 2,779,998 | 2/1957 | Bailey. | |
| 2,885,602 | 5/1959 | Emerson et al. | 339—17 X |
| 2,907,976 | 10/1959 | Damon | 339—17 X |
| 3,125,396 | 3/1964 | Bertram | 339—258 X |
| 3,168,366 | 2/1965 | Fuller | 339—220 |
| 3,175,181 | 3/1965 | Grabbe | 339—278 |

FOREIGN PATENTS

| | | |
|---|---|---|
| 75,651 | 2/1919 | Austria. |
| 910,748 | 2/1946 | France. |
| 1,043,428 | 6/1953 | France. |
| 317,343 | 21/1919 | Germany. |
| 637,065 | 10/1936 | Germany. |
| 1,024,602 | 2/1958 | Germany. |

JOSEPH D. SEERS, *Primary Examiner.*